United States Patent

Chen et al.

[11] Patent Number: 6,161,053
[45] Date of Patent: Dec. 12, 2000

[54] IN-SITU BINARY PCM CODE INDENTIFIER TO VERIFY A ROM CODE ID DURING PROCESSING

[75] Inventors: Hsin Pai Chen, Hsin-Chu; Shaw Teung Yu, Taipei; Jyh Cheng You, I-Lan; Wei Kun Yeh, Hsin-Chu, all of Taiwan

[73] Assignee: Taiwan Semiconductor Manufacturing Co., Ltd, Hsin Chu, Taiwan

[21] Appl. No.: 09/140,038

[22] Filed: Aug. 26, 1998

[51] Int. Cl.⁷ .................................................. G06F 19/00
[52] U.S. Cl. .......................... 700/121; 702/193; 714/718; 438/14
[58] Field of Search ..................................... 700/121, 116; 395/500.85; 714/721, 41, 718, 720; 702/193, 119, 110, 64; 438/268, 272, 273, 290, 291, 297, 303–308, 14, 17–18, 275–278; 365/201, 103, 104

[56] References Cited

U.S. PATENT DOCUMENTS

| | | | |
|---|---|---|---|
| 3,914,855 | 10/1975 | Cheney et al. | 438/130 |
| 4,176,442 | 12/1979 | Bischoff et al. | 438/6 |
| 4,591,891 | 5/1986 | Chatterjee et al. | 438/275 |
| 5,248,936 | 9/1993 | Nakata et al. | 324/73.1 |
| 5,523,252 | 6/1996 | Saito | 438/18 |
| 5,538,906 | 7/1996 | Aoki | 438/278 |
| 6,031,771 | 2/2000 | Yiu et al. | 365/200 |
| 6,061,606 | 5/2000 | Ross | 700/121 |
| 6,072,737 | 6/2000 | Morgan et al. | 365/201 |

*Primary Examiner*—William Grant
*Assistant Examiner*—Chad Rapp
*Attorney, Agent, or Firm*—Tung & Associates

[57] ABSTRACT

A method and means for testing binary code devices, such as ROMs, for correct coding during processing with the Process Control Machine (PCM) for the fabrication process by applying it on the scribe-line built-in binary code devices, and using the testing program to measure the threshold voltage VTN of the code devices and convert the binary signal sensed to a decimal number to identify the ROM code id. After finishing wafer processing and PCM testing, the real ROM code id that has been fabricated can be read from the PCM testing report.

9 Claims, 1 Drawing Sheet

IN-SITU BINARY PCM CODE INDENTIFIER TO VERIFY A ROM CODE ID DURING PROCESSING

FIELD OF THE INVENTION

The present invention generally relates to the fabrication of integrated circuit wafers having binary code devices, such as read-only-memories (ROMs), thereon and, more particularly, to a method and means for testing the code content of the ROMs during fabrication processing to verify the ROM code id before the completion of wafer fabrication.

BACKGROUND OF THE INVENTION

1. Prior Art

In integrated circuit fabrication technology, read-only-memory (ROM) devices are implanted during processing with binary codes according to special or custom orders. However, it is difficult during the wafer processing to verify whether the code content in a ROM is correct or not, so that currently whether the intended or the real code id was actually implanted is not confirmed until after fabrication processing is completed when chip probing yield testing is performed on the wafer. The difficulty stems from, among other things, the fact that when wet dipping is used during processing after code implantation further oxide loss is caused and the process window becomes marginal, leaving insufficient time for testing. Also, in $0.6\mu$ or less processing, implementation of the code dip is not suitable because it will result in process integration problems with oxide loss and implant dosage. Hence, presently in the art, defective ROMs are not tested and detected until after fabrication has been completed.

2. Problem to be Solved

Due to the inability to test the ROMs for correct coding during processing, erroneous coding may not be identified until after fabrication and shipping so that the cycle time for making adjustments to the process when errors are found to occur is extended beyond an optimum period. Also, ROMs with erroneous code content may pass through the testing.

3. Objects

It is therefore an object of the present invention to provide a method and means to save cycle time by identifying ROM code id during processing rather than waiting for subsequent yield testing after fabrication completion.

It is another object of the invention to guarantee a ROM code content 100% consistent with that ordered in a semiconductor wafer having a ROM array.

SUMMARY OF THE INVENTION

The present invention is directed to a method and means for testing ROMs for correct coding during processing and thus reducing the cycle time for making adjustments to the fabrication process when errors are found to occur. More particularly, the Process Control Machine (PCM) used in the fabrication process, which typically may be of a type familiar to those of skill in the art that is manufactured and sold by Hewlett-Packard (HP) Corp., is also used in the testing by applying it on the scribe-line built-in binary code devices during processing. The binary signals of the ROMs are sensed and converted to a decimal number to identify the ROM code id. For example, in processing code mask (003) wafers, a special mask patterning process is used wherein the pattern is formed with an electron beam (EBO) which applies the code in the ROMs. The EBO can modify the tape data base of the chip code and the PCM code devices by using 011 at the same time as doing the masking. Then, the HP machine is applied on the scribe-line built-in binary code devices and the testing program measures the threshold voltage VTN of the code devices and can transfer the 003 code to a decimal number easily in code mask (003) wafers. In a particular test, 7 parallel code devices may be inserted into the PCM testing block which can detect 128 code numbers ($2^7$) at maximum. After finishing wafer processing and PCM testing, the real ROM code id that has been fabricated can be read from the PCM testing report. This method saves cycle time in identifying ROM code id, which could previously only be checked out and confirmed after yield testing. Ultimately, it guarantees 100% consistent ROM code content in accordance with a custom order.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
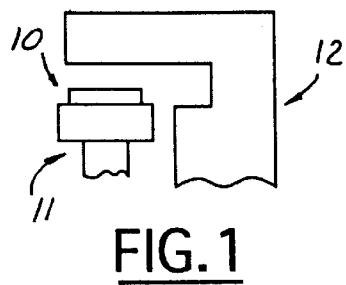
FIG. 1 is a diagram illustrating a semiconductor wafer being processed in accordance with the present invention.

The present invention provides a method and means for testing the code content in binary code devices, such as ROMs, during wafer processing to enable early detection of coding errors and thus reduce the cycle time for making adjustments to the fabrication process when errors are found to occur. The testing is carried out with the Process Control Machine (PCM) used in the fabrication process, such as shown in FIG. 1 wherein a wafer 10 being processed is mounted on a chuck 11 with a PCM 12 disposed adjacent thereto. The PCM 12 is preferably of the known type available from Hewlett-Packard (HP) Corp. and is utilized in the testing by applying it on the scribe-lines built-in the binary code devices. The binary signal sensed in each device is converted to a decimal number to identify the ROM code id. After finishing wafer processing and PCM testing, the real ROM code id that has been fabricated can be read from the PCM testing report.

Figure 2:
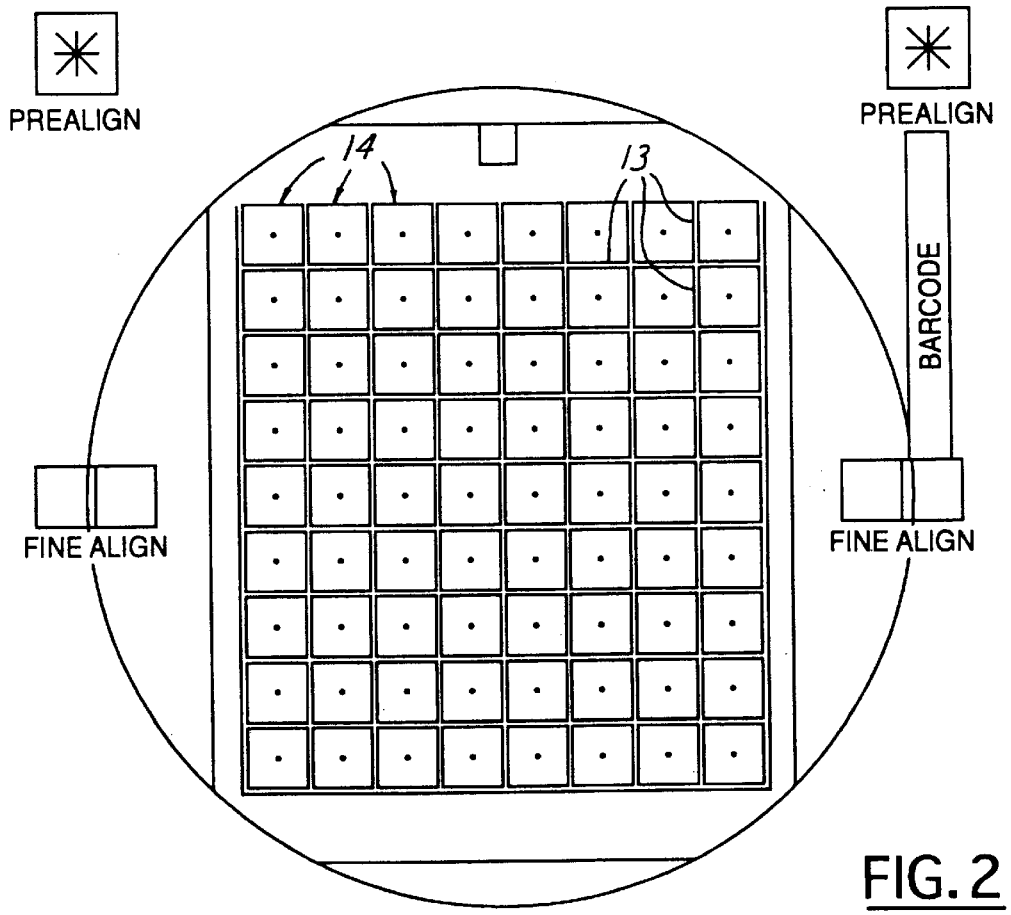
FIG. 2 is an illustration of the face of a wafer having a matrix of binary code devices or ROMs thereon, with exemplary dimensions, and on the scribe-lines of which process control monitor testing is applied and the code transferred to decimal numbers to identify the ROM code id in accordance with the present invention.

The method involves, for example, in the fabrication of code mask (003) wafers, a special mask patterning process whereby the pattern is formed with an electron beam (EBO) which applies the code in the ROMs. The EBO can modify the tape data base of the chip code and the PCM code devices by using 011 at the same time as doing the masking. A particular processed wafer surface is shown in FIG. 2, along with an exemplary set of dimensions, and indicating the matrix of scribe-lines 13 built-in the ROMs 14 thereon. The PCM or HP machine is applied on the scribe-lines and the testing program measures the threshold voltage VTN of the code devices and can transfer the 003 code in the code mask (003) wafers easily to a decimal number.

Figure 3:
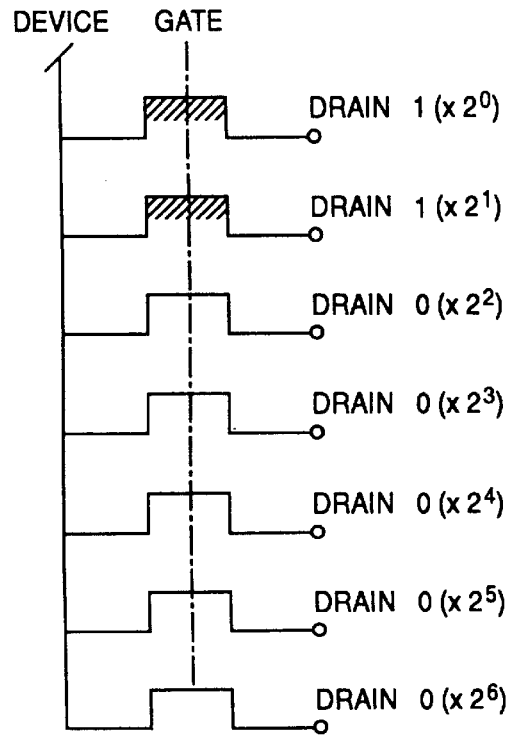
FIG. 3 is an illustration of seven parallel binary code devices forming a portion of a ROM that may be subjected to process control monitor transfer testing in accordance with the present invention.

In a particular test, as illustrated in FIG. 3, seven parallel code devices may be inserted into the PCM testing block which can detect 128 code numbers ($2^7$) at maximum. The threshold voltage VTN of each of the code devices is transferred at the scribe-line and converted by the HP machine testing program to a decimal number for recording in the PCM. After finishing wafer processing and PCM testing, the real ROM code id that has been fabricated can be read from the PCM testing report. Any errors can then be corrected before completing processing and shipping.

It will therefore be seen that the method and means of the invention saves cycle time in identifying erroneous ROM code id, which could previously only be checked out and confirmed after chip probing yield testing. Additionally, it guarantees 100% consistent ROM code content for custom orders.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the invention.

The embodiment of the invention in which an exclusive property or privilege is claimed are defined in the following claims:

What is claimed is:

1. A method for testing the code content in binary code devices, such as ROMs, during wafer fabrication processing to determine coding errors, comprising the steps of:

providing a wafer for processing and during said processing, forming an array of binary code devices thereon including scribe-lines built-in the binary code devices;

applying code in the binary code devices during processing to provide the code content therein in the form of a binary signal in each binary code device convertible to a decimal number indicative of a ROM code id;

applying a Process Control Machine (PCM) used in the fabrication processing on the scribe-lines built-in the binary code devices;

sensing the binary signal in each binary code device and using the PCM testing program to convert it to a decimal number to identify the ROM code id; and finishing wafer processing and PCM testing, and reading the ROM code id that has been fabricated into the binary code devices during processing from the PCM testing report.

2. A method according to claim 1, wherein the step of sensing the binary signal comprises measuring the threshold voltage (VTN) of the binary code device.

3. A method according to claim 1, wherein the fabrication processing comprises:

applying a special mask patterning process and forming a pattern with an electron beam (EBO) which applies the code in the ROMs.

4. A method according to claim 3, wherein the fabrication processing further comprises:

using the EBO to modify the tape data base of the chip code and the PCM code devices by using 011 at the same time as doing the mask patterning.

5. Apparatus for testing the code content in binary code devices, such as ROMs, during semiconductor wafer fabrication processing to determine coding errors, comprising:

a Process Control Machine (PCM), having a testing program, for controlling semiconductor wafer fabrication processing;

means, under the control of said PCM and during said semiconductor wafer fabrication processing, for forming an array of binary code devices on a semiconductor wafer including scribe-lines built-in the binary code devices;

means, under the control of said PCM, for applying code in the binary code devices to provide the code content therein in the form of a binary signal in each binary code device convertible to a decimal number indicative of a ROM code id;

means for applying the PCM during the fabrication processing on the scribe-lines built-in the binary code devices;

means for sensing the binary signal in each binary code device and using the PCM testing program to convert said signal to a decimal number to identify the ROM code id; and means for reading the ROM code id that has been fabricated from the PCM testing report upon finishing wafer processing and PCM testing.

6. Apparatus as in claim 5 wherein said binary signal sensing means comprises means for measuring the threshold voltage (VTN) of the binary code device.

7. Apparatus as in claim 5 wherein said means for sensing the binary signal comprises means for measuring the threshold voltage (VTN) of the binary code device.

8. Apparatus as in claim 5, wherein the PCM fabrication processing comprises:

means for applying a special mask patterning process and forming a pattern with an electron beam (EBO) which applies the code in the ROMs.

9. Apparatus as in claim 8, wherein the PCM fabrication processing further comprises:

means for using the EBO to modify the tape data base of the chip code and the PCM code devices by using 011 at the same time as doing the mask patterning.

* * * * *